United States Patent [19]

Tsukada et al.

[11] Patent Number: 5,607,535
[45] Date of Patent: Mar. 4, 1997

[54] METHOD OF MANUFACTURING A LAMINATED PIEZOELECTRIC ACTUATOR

[75] Inventors: Mineharu Tsukada; Koji Omote, both of Kawasaki, Japan

[73] Assignee: Fujitsu, Ltd., Japan

[21] Appl. No.: 201,987

[22] Filed: Feb. 25, 1994

[30] Foreign Application Priority Data

May 20, 1993 [JP] Japan .................... 5-117475

[51] Int. Cl.$^6$ .................................... B32B 31/18
[52] U.S. Cl. ..................... 156/252; 156/250; 156/89; 264/61; 264/67; 29/25.35
[58] Field of Search ............... 156/89, 250, 252; 29/25.35; 310/311, 364, 367; 264/58, 61, 67

[56] References Cited

U.S. PATENT DOCUMENTS

| 4,523,121 | 6/1985 | Takahashi et al. ............... 310/334 |
| 4,574,255 | 3/1986 | Fujii et al. ..................... 501/134 X |
| 4,742,264 | 5/1988 | Ogawa ........................... 310/332 |
| 4,759,107 | 7/1988 | Ogawa et al. ................... 29/25.35 |
| 5,113,566 | 5/1992 | Weekamp et al. ............... 29/25.35 |
| 5,196,756 | 3/1993 | Kohno et al. ................... 310/364 X |
| 5,245,734 | 9/1993 | Issartel ........................... 29/25.35 |

FOREIGN PATENT DOCUMENTS

| 0079482 | 3/1990 | Japan ............................. 29/25.35 |
| 3280412 | 12/1991 | Japan . |

OTHER PUBLICATIONS

Japanese Laid–Open Patent Application No. 06–151999, "Manufacture of Laminated Piezoelectric/Electrostrictive Acuator Element", Issue Date: Nov. 9, 1992, Abstract.

Primary Examiner—David A. Simmons
Assistant Examiner—M. Curtis Mayes
Attorney, Agent, or Firm—Nikaido, Marmelstein, Murray & Oram, LLP

[57] ABSTRACT

A method of manufacturing a laminated piezoelectric actuator including at least an actuator element which has a plurality of piezoelectric ceramics layers and internal electrode layers laminated alternately and external electrodes which connect alternate internal electrode layers in two groups. The method places a conductor layer on a piezoelectric ceramic green sheet for use as internal electrodes; bores a plurality of slits through the conductor layer-placed green sheet such that the slits are arranged in a line along the X axis of an orthogonal X-Y coordinates given arbitrarily in a plane of the green sheet with the lengthwise side perpendicular to the X axis, at an interval of a predetermined length and the slits in adjacent two lines are staggered by half the predetermined length; bores at least two positioning holes in the conductor layer-placed green sheet, symmetrically with respect to an intersection of a straight line crossing a center of a particular slit along the Y axis and another straight line passing a middle of adjacent two particular lines along the X axis; superposes a plurality of the positioning hole-bored green sheets with alternate green sheets rotated 180 degrees in the plane, based on the positioning holes; produces a parent actuator having the piezoelectric ceramics layers and internal electrode layers laminated alternately, from the thus-superposed green sheets; cuts the ceramics perpendicularly to produce the actuator element 11 Claims, 9 Drawing Sheets

METHOD OF MANUFACTURING A LAMINATED PIEZOELECTRIC ACTUATOR

BACKGROUND OF THE INVENTION

1. Field of the Invention

The present invention relates to a method of manufacturing a laminated piezoelectric-electrostrictive actuator (hereinafter called piezoelectric actuator or simply actuator) or more particularly to a method of mass-producing a laminated piezoelectric actuator.

As mechatronics which applies electronics to machinery is developing in recent years, more and more attention is being paid to actuator technology. An actuator is a device to perform a process control by use of pneumatic, hydraulic or electronic signals; for example, a driver for driving a print head of a dot printer.

Most actuators are activated by use of electromagnetic power. For instance, a dot printer uses an electromagnet which is constructed by winding an excitation coil on a magnet base of a soft ferromagnetic material as an actuator.

The print head, which has a printing wire provided on its point, is driven such that the print head is attracted to and released from the electromagnet by a signal current flowing through the excitation coil. Printing is performed when the print head projects the printing wire. However, it is a problem that an actuator using electromagnetic power is power-consuming and generates heat and electromagnetic noise and, therefore, a new type of actuator free from this problem is desired.

Meanwhile, since an actuator utilizing piezoelectric effect of a strong dielectric substance is not only free from this problem but is small-sized and light-weight and also proof against vibration and impact, its practical use or a method of mass-producing a laminated piezoelectric actuator is in great demand.

2. Description of the Related Art

It is well-known that a type of ceramic shows the best characteristics for the actuator utilizing the piezoelectric effect.

The ceramics of ferroelectric material are made by firing lead-nickel niobate, lead titanate, and lead zirconate mixed in an appropriate molecular weight ratio. A laminated ceramic capacitor-type actuator is well-known as a piezoelectric actuator.

Figure 1:
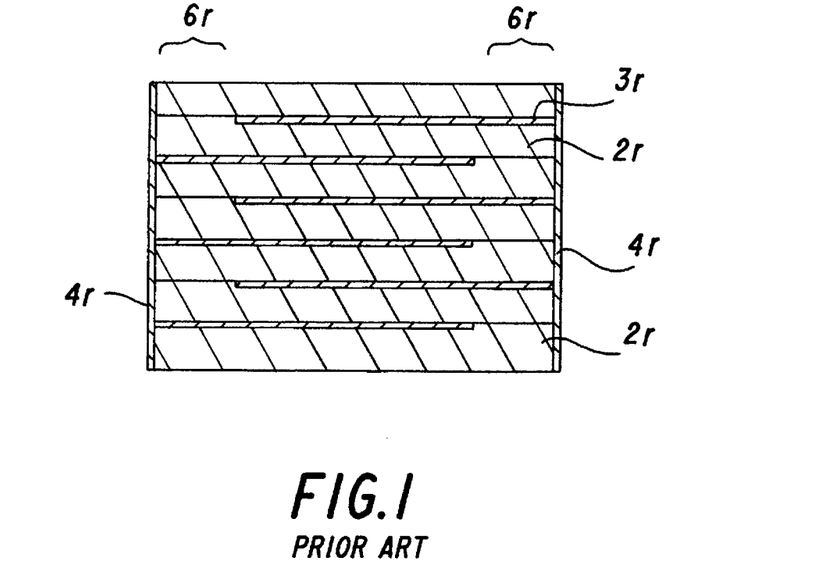
FIG. 1 is a sectional diagram showing a first type of actuator of the related prior art of the present invention.

FIG. 1 is a sectional diagram showing a first type of actuator of the related art of the present invention, i.e., an actuator of a laminated ceramic capacitor type.

The laminated ceramic capacitor-type piezoelectric actuator is fabricated through the following processes:

A solvent, a binder and a plasticizer are added to the above-mentioned mixture of the three ceramics materials and the mixture is kneaded to produce a slurry. The slurry is deposited and finished to a pre-determined thickness using the 'doctor blade method' and dried to produce a green sheet.

Conductive paste is screen-printed on the green sheet to form an internal electrode layer thereon in such a pattern that, when the green sheet is cut into a size of a unit actuator element in a later process, an internal electrode $3r$ reaches the very end on one side of and partway to the end on the opposite side (with a margin $6r$ left as shown in FIG. 1) of the actuator element.

A plurality of green sheets with the internal electrode layer thus-printed are superposed in layers such that, when they are cut into the actuator element in the later process, the margin $6r$ and the internal electrode $3r$ appear alternately on each side of the actuator element.

The superposed green sheets are pressurized to be integrated in laminated layer, heated at a low temperature to remove the binder, then heated at a high temperature to sinter the ceramic raw material powder into a ceramics $2r$. The thus-formed laminated ceramic layers $2r$ with the internal electrode layers sandwiched in between (hereinafter called parent actuator) are cut into a plurality of actuator elements. Conductive paste is spread on each side of the actuator element where the internal electrodes $3r$ appear and fired to form an external electrode $4r$. Thus, an actuator $5$ as shown in FIG. 1 is completed.

With the actuator thus fabricated, only the area sandwiched between the upper and lower internal electrodes $3r$ acts as an active region and performs a piezoelectric operation. However, the area including the margin $6r$, which becomes an inactive region since no voltage is applied thereto, does not perform a piezoelectric operation. Eventually, a problem has become clear that the boundary area between the active and inactive regions is easily destroyed, as a result of a life test which drives continuous pulses to the actuator.

To solve the problem, an overall electrode-type actuator was proposed.

Figure 2:
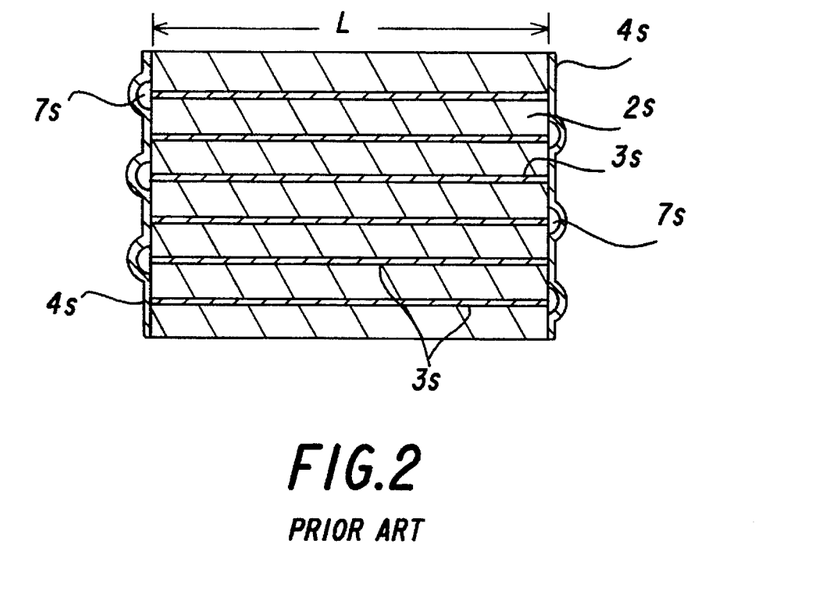
FIG. 2 is a sectional diagram showing a second type of actuator of the related prior art of the present invention.

FIG. 2 is a sectional diagram showing second type of actuator of the related art of the present invention, i.e., an actuator of an overall electrode type.

The overall electrode-type actuator is fabricated through the following processes:

A plurality of the above-mentioned green sheets are each printed with an internal electrode layers over the whole surface, superposed in layers and thereafter, made into actuator elements through the same processes as in the above example. Portions of the internal electrodes $3s$ which appear on the sides of the actuator element are covered with insulators $7s$ alternately on each side, by applying an insulating material such as glass paste thereon.

Finally, conductive paste is spread on both sides of the actuator element, over the insulators $7s$ and then fired to form the external electrodes $4s$. The actuator thus fabricated has an extended life time because it does not have an inactive region.

However, a problem is that insulation coating work requires much intricate labor, and therefore the ceramics $2s$ or green sheet $1$ cannot be too thin, considering the ease of work.

Figure 3A:
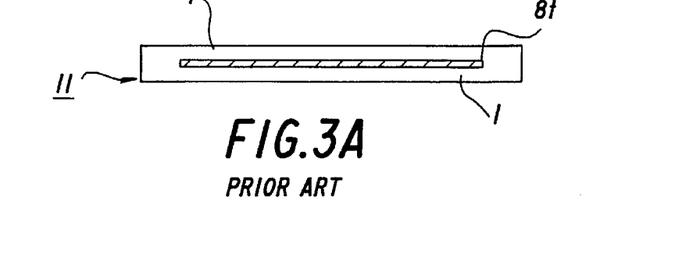
FIG. 3A is a sectional diagram showing a bonded sheet for use in a third type of actuator of the related prior art of the present invention.
Figure 3B:
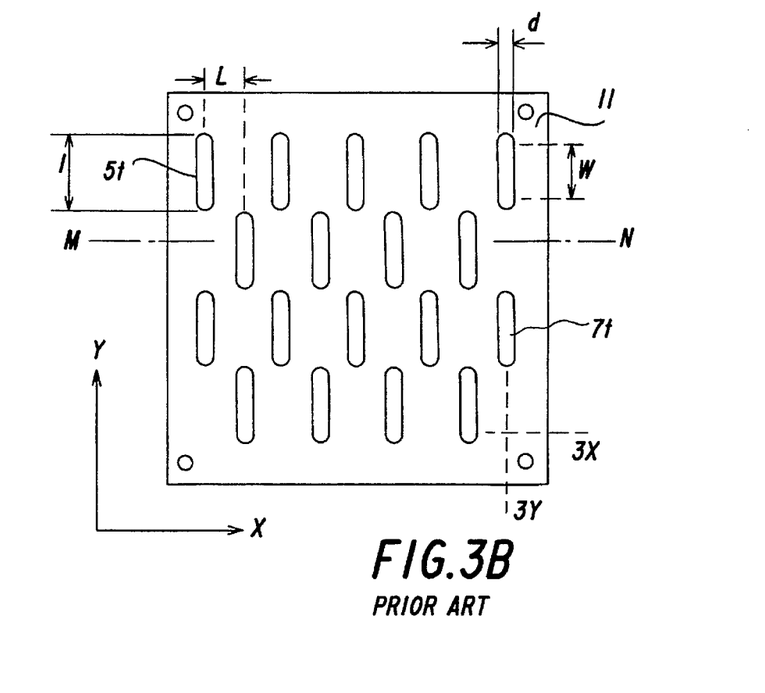
FIG. 3B is a top plan view of the bonded sheet shown in FIG. 3A with slits bored therethrough.
Figure 3C:
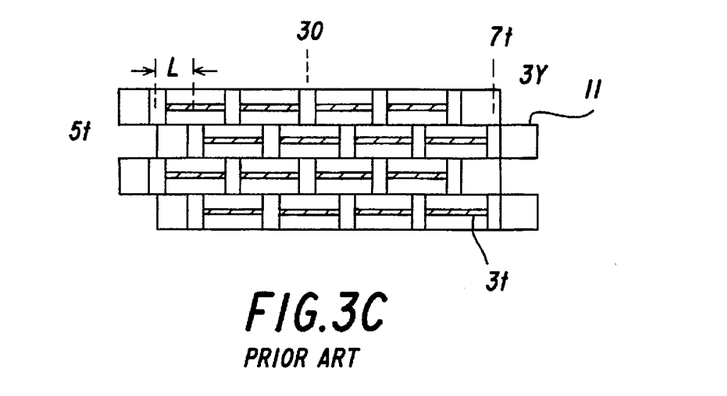
FIG. 3C is a sectional diagram showing the slit-bored bonded sheets superposed in layers.

FIGS. 3A–3C are diagrams showing third type of laminated piezoelectric actuator of the related art of the present invention.

The actuator of this type is fabricated through the following processes:

First, conductive paste is applied over the entire surface of the above-mentioned green sheet $1$, to form an internal electrode layer $8t$. The green sheet $1$ is covered with another green sheet $1$, with the internal electrode layer $8t$ sandwiched and they are pressurized to form a bonded sheet $11$ as shown in FIG. 3A.

Next, by using an automatic punch, a plurality of slits $5t$ having a length $l$ and a width $d$ along Y and X axes, respectively are bored through the bonded sheet $11$ at an interval $2L$ (twice the spacing $L$ of an actuator element) in a lines, with the slits $5t$ in adjacent lines staggered by the spacing $L$, as shown in FIG. 3B.

Then, insulator paste (e.g., glass-ceramics) is stuffed into the slits $5t$ of the bonded sheet $11$ to form an insulator $7t$ therein. A plurality of the bonded sheets 11 are superposed in layers, with the slits 5t of adjacent (upper and/or lower) layers staggered in parallel, by the length L, as shown in FIG. 3C. The superposed bonded sheets 11 are pressurized to be integrated and fired as described above to produce a parent actuator which has ceramics layers laminated with internal electrode layers sandwiched therebetween and insulators 7t stuffed in the slits 5t and which is an aggregation of actuator elements.

Cutting the parent actuator along dotted lines 3X, 3Y as shown in FIGS. 3B and 3C (FIG. 3C is a sectional view taken along line M-N of FIG. 3B) produces actuator elements 30 with internal electrodes 3t and insulators 7t appearing alternately on the opposite sides of the actuator element 30. When an external electrode 4t is provided by screen-printing and baking silver (Ag) paste, for example, on both sides of the actuator element, an actuator is completed. However, although the thus-fabricated actuator does not have an inactive region, the manufacturing process requires such intricate labor as producing the bonded sheets 11 and superposing a few tens to a few hundreds of them exactly in layers, with vertically adjacent layers staggered by a predetermined spacing L, and therefore it is difficult to mass produce in this example, too.

In summary, it is a problem with the related art that the actuator has a short lifetime and/or the manufacturing process is not suited for mass production.

SUMMARY OF THE INVENTION

It is an object of the present invention to provide a method of manufacturing a laminated piezoelectric actuator which is small-sized and has a long life.

It is another object of the present invention to provide a method of mass-producing a laminated piezoelectric actuator.

To achieve the above and other objects, the present invention provides a method of manufacturing a laminated piezoelectric actuator including at least an actuator element having a plurality of piezoelectric ceramics layers, internal electrodes laminated alternately, and external electrodes connecting alternate internal electrodes in two groups, through the steps of:

(a) providing a conductor layer on a piezoelectric ceramic green sheet for use as the internal electrodes;

(b) boring a plurality of holes through the green sheet formed in step (a) such that the holes are arranged in a line along an X axis of orthogonal X-Y coordinates which are arbitrarily in a plane of the green sheet, at an interval of a predetermined spacing and the holes in two adjacent; lines are staggered by half the predetermined spacing;

(c) superposing a plurality of green sheets formed in step (b) such that the holes of alternate green sheets are aligned with each other with the conductor layers of intervening green sheets sandwiched in between;

(d) producing a parent actuator having piezoelectric ceramics layers and internal electrode layers laminated alternately, from the green sheets superposed in step (c);

(e) cutting the parent actuator perpendicularly to the plane of the X-Y coordinates along a first straight line crossing the centers of the holes along a Y axis of the X-Y coordinates and along a second straight line crossing the holes along the X axis of the same coordinate system, to produce an actuator element having first sides and second sides which are sections developed by cutting the parent actuator along the first and second straight lines, respectively; and (f) forming the external electrodes by connecting a conductor to portions of the internal electrodes appearing alternately on the first sides of the actuator element.

BRIEF DESCRIPTION OF THE DRAWINGS

Throughout the above-mentioned drawings, identical reference numerals are used to designate the same or similar component parts.

DESCRIPTION OF THE PREFERRED EMBODIMENTS

Figure 6A:
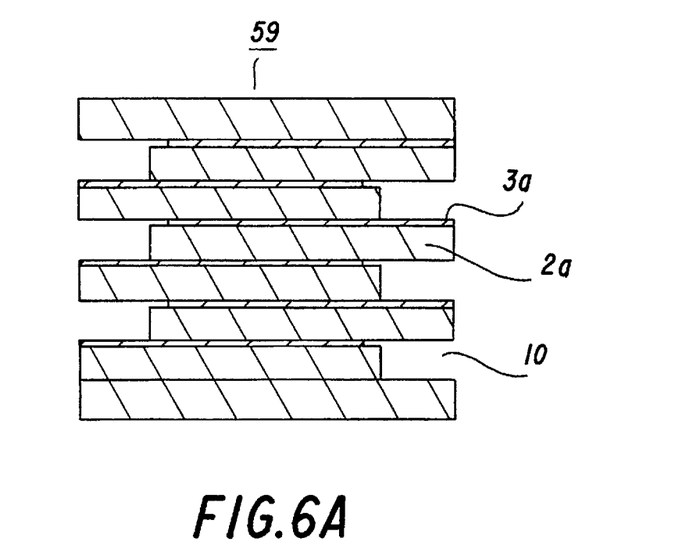
FIG. 6A is a conceptual sectional diagram illustrating an actuator element of the first embodiment of the present invention.
Figure 6B:
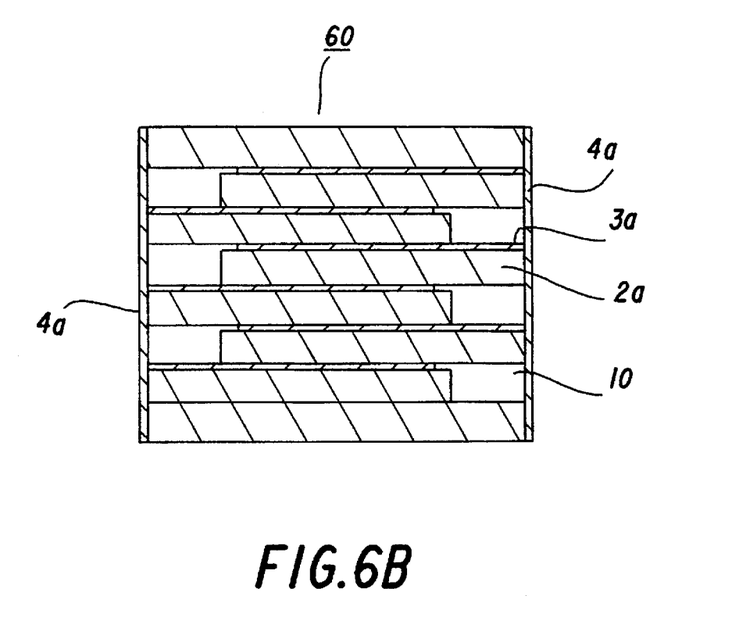
FIG. 6B is a conceptual sectional diagram illustrating an actuator of the first embodiment of the present invention.
Figure 6C:
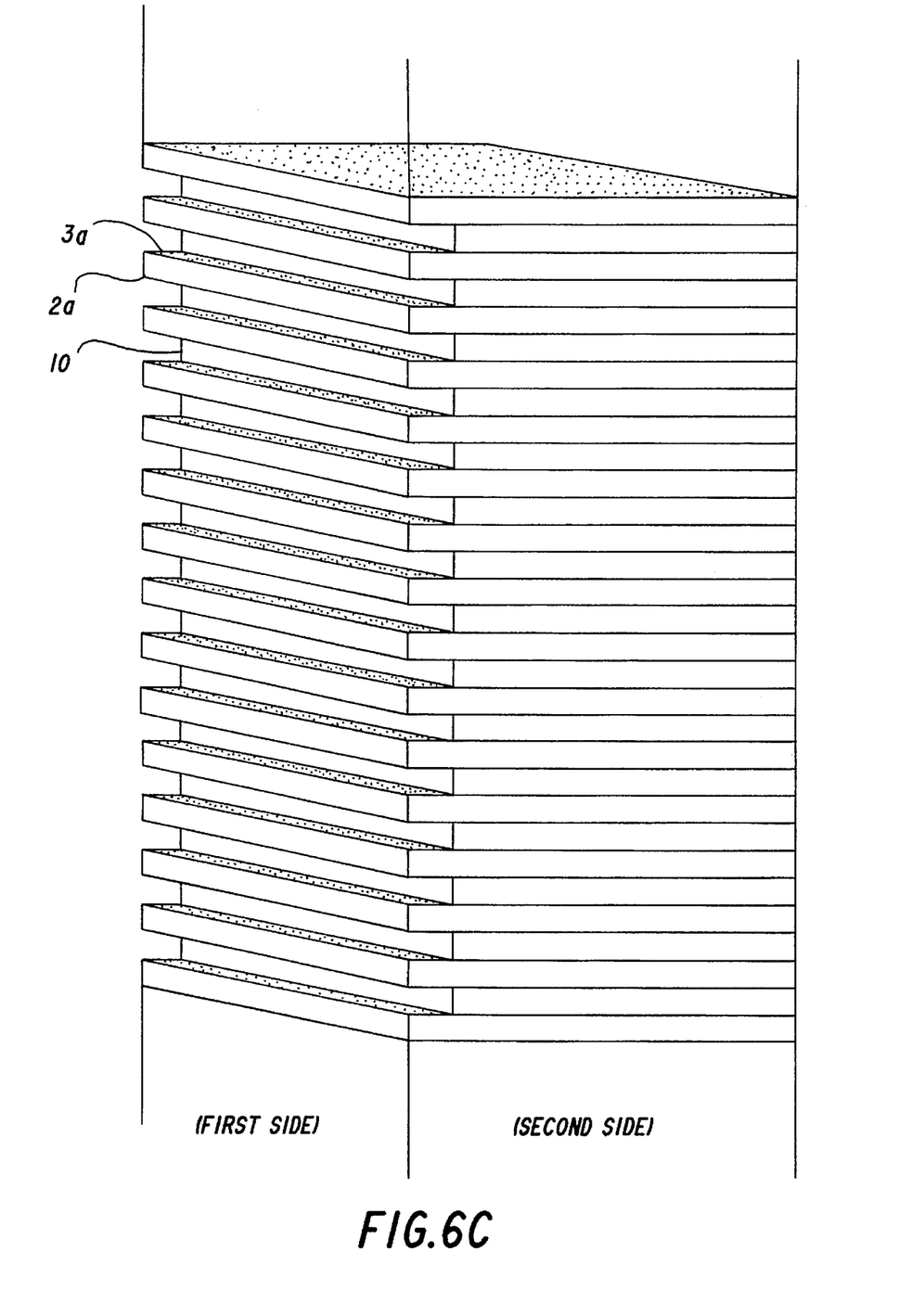
FIG. 6C is a perspective view of an actuator element of the first embodiment of the present invention.

FIG. 6A is a conceptual sectional diagram illustrating an actuator element of the first embodiment of the present invention. FIG. 6B is a conceptual sectional diagram illustrating an actuator of the first embodiment of the present invention. FIG. 6C is a perspective view of an actuator element of the first embodiment of the present invention.

Figure 6D:
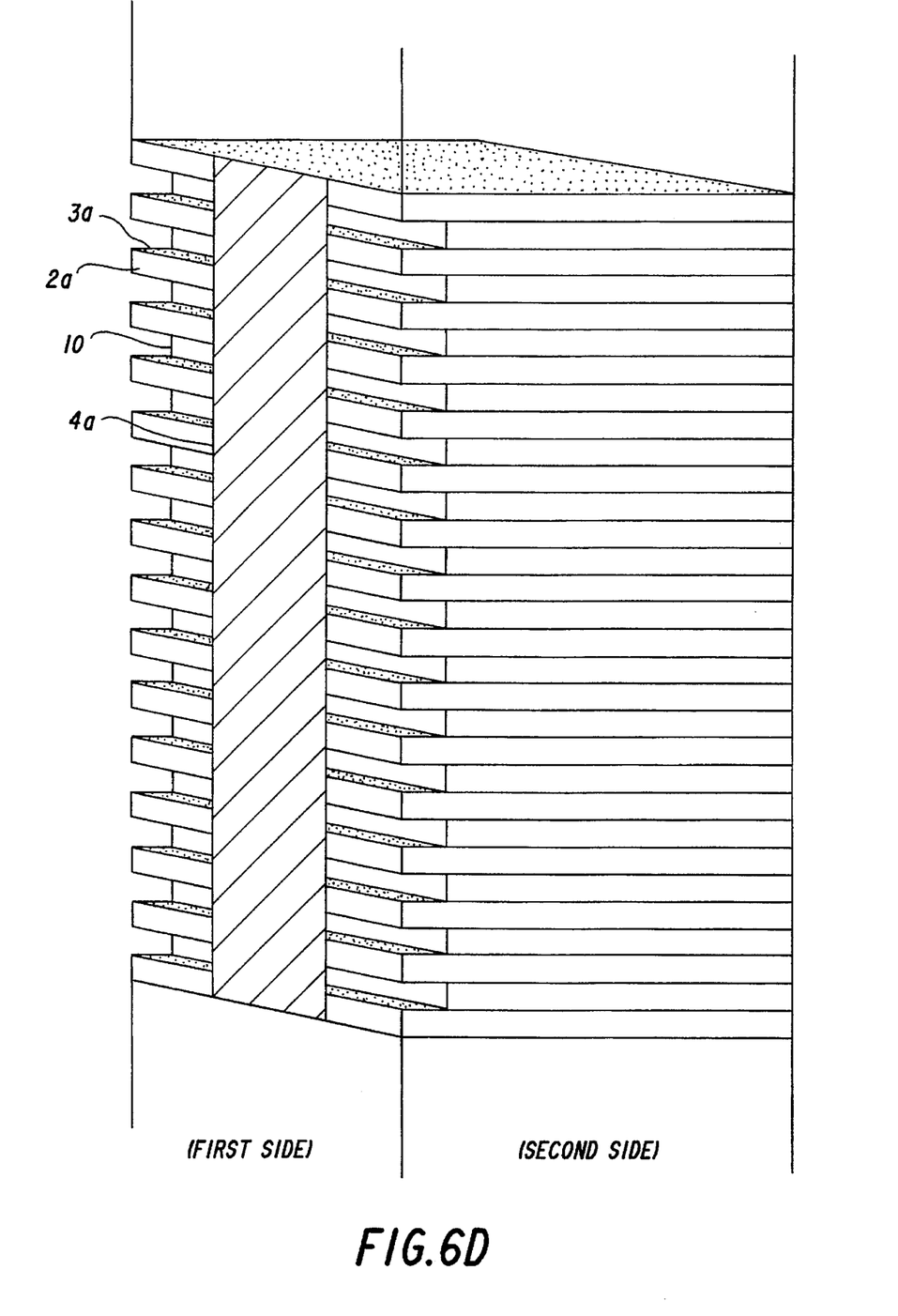
FIG. 6D is a perspective view of an actuator of the first embodiment of the present invention.

FIG. 6D is a perspective view of an actuator of the first embodiment of the present invention.

Figure 4:
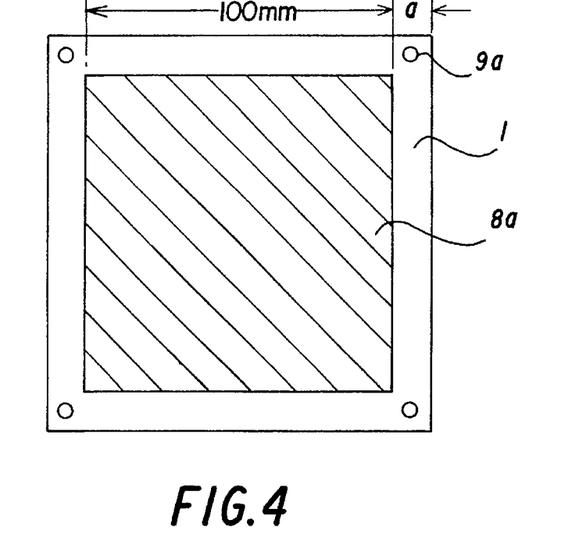
FIG. 4 is a top plan view of a green sheet and an internal electrode layer formed thereon for use in the actuator shown in FIG. 6C.
Figure 5:
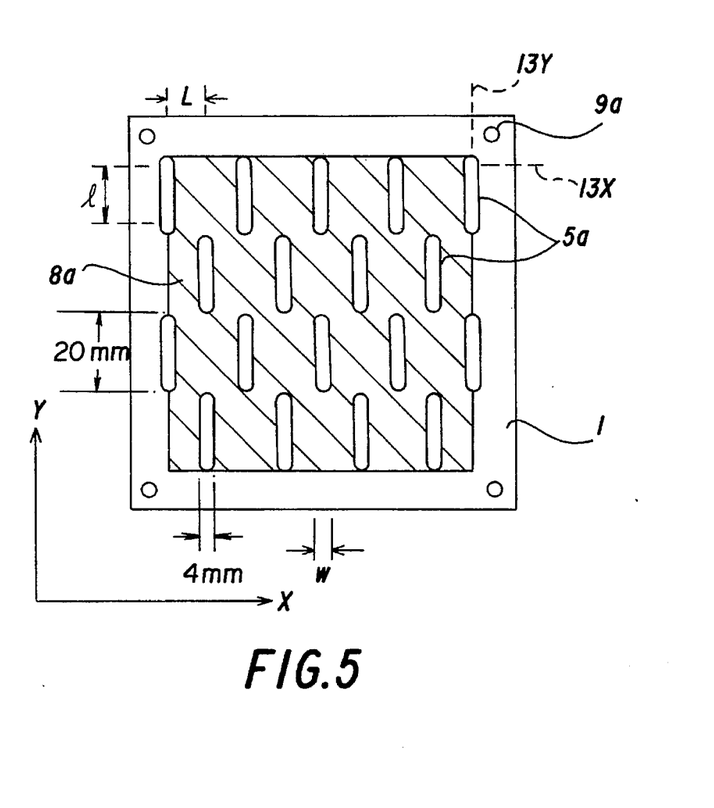
FIG. 5 is a top plan view of the green sheet shown in FIG. 4 with slits bored therethrough.

FIG. 4 is a top plan view of a green sheet 1 and an internal electrode layer 8a formed thereon for use in the actuator shown in FIG. 6B. FIG. 5 is a top plan view of the green sheet shown in FIG. 4 with slits 5a bored therethrough.

The laminated ceramic piezoelectric actuator of the first embodiment is fabricated through the following processes:

Lead-nickel niobate [$Pb(Ni_{1/3}Nb_{2/3})O_3$], lead titanate ($PbTiO_3$) and lead zirconate ($PbZrO_3$) are mixed in the molecular weight ratios 0.5:0.35:0.15 and kneaded together with ethanol, dibutyl phthalate (DBP) and polyvinyl butyral (PVB) which are added as a solvent, a plasticizer and a binder, respectively to produce a slurry. The slurry is deposited and finished to approx. 80 micron thickness by using the doctor blade method and then dried to produce a green sheet.

The green sheet is cut to a green sheet 1 of approx. 100 mm square (see FIG. 4). Silver palladium (Ag—Pd) paste is screen-printed over the surface of the green sheet 1 with a margin having a width α left about the circumference, as shown in FIG. 4, to form a 5 micron-thick internal electrode layer 8a.

Next, by using an automatic punch, a plurality of slits 5a having a length l longer than the width W of an actuator element are bored through the green sheet 1 shown in FIG. 4 such that the slits 5a are arranged in lines parallel to the X axis, at intervals of at least twice the spacing L of the actuator elements with the slits 5a in two adjacent lines are space apart by the distance L (see FIG. 5).

Four positioning holes 9a are provided at four corners of the green sheet 1, on the diagonals and symmetrically with respect to the center of the green sheet 1. After the green sheets 1 are made into a parent actuator having ceramics layers 2a and internal electrode layers 3a laminated alternately in the later process, the parent actuator is cut perpendicularly to the planes of the layers, along the dotted lines 13X and 13Y shown in FIG. 5 and therefore, two actuator elements are obtained from between a pair of the adjacent slits 5a arranged in a line along the X axis (L and l are the length and width of an actuator element, respectively). In a preferred embodiment, the distance between the lines of slits along the X-axis is equal or larger than the length of the slits Actually, 4 mm-wide and 20 mm-long slits 5a are bored through the green sheet 1. 150 green sheets 1 having the slits 5a bored therethrough are laminated exactly in place based on the four positioning holes 9a, with every other green sheet 1 rotated 180 degrees in the plane. In addition, 20 dummy layers without a slit are each placed on top and bottom of the 150 green sheets 1. The superposed green sheets 1 and dummy layers are subjected to a pressure of 50 mega-pascals (M Pa) and integrated to form a laminated body.

The laminated body is heated in an electric furnace up to 500 degrees centigrade (° C.) at the rate of 2° C. per hour and kept at 500° C. for 10 hours to be dewaxed. Then, it is heated up to 1100° C. at the rate of 200° C. per hour and kept at 1100° C. for 2 hours to produce a parent actuator having ceramics layers 2a and internal electrode layers 3a laminated alternately.

The parent actuator is cut along the dotted lines 13X and 13Y shown in FIG. 5 into actuator elements 59 with the internal electrodes 3a and cavities 10 (whose width is half that of the width W of the slit 5a) appearing alternately on opposite sides (first sides) of the actuator element 59 (see FIGS. 6C and 6D). The first sides (left and right sides in FIG. 6A) of the actuator element 59 are metallized to form the external electrodes 4a and thus an actuator 60 is completed (see FIGS. 6B and 6D).

Incidentally, the internal electrode 3a on the cavity 10 side, which should be insulated from the adjacent one or sealed, is slightly (i.e., half the width of the slit 5a, see FIG. 5) inside the side of the actuator element. Eventually, there is a problem that two adjacent internal electrode layers 8a might be short-circuited on the side of the actuator element when the external electrode 4a is made of such a material having permeability as conductive paste.

To prevent this problem, in this example, a 100 micron-thick silver (Ag) foil is pressed to each side of the actuator element by using a jig and is heated at 600° C. for 30 minutes in the air to form the external electrode 4a. A lead wire is soldered to each external electrode 4a. Applying 100 volts dc across the external electrodes 4a causes a polarization, completing a laminated piezoelectric actuator.

Figure 9:
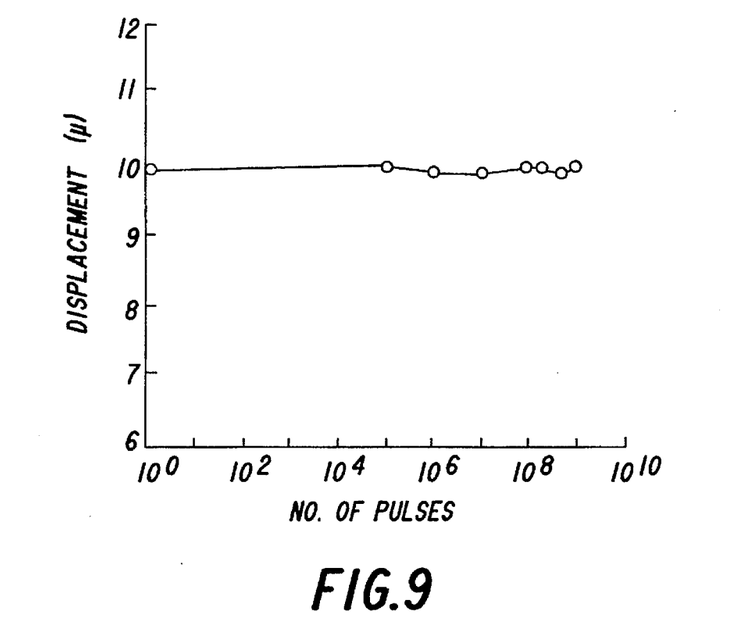
FIG. 9 is a diagram illustrating a change in displacement as a result of a life test conducted on the actuator of the first embodiment of the present invention.
Figure 10:
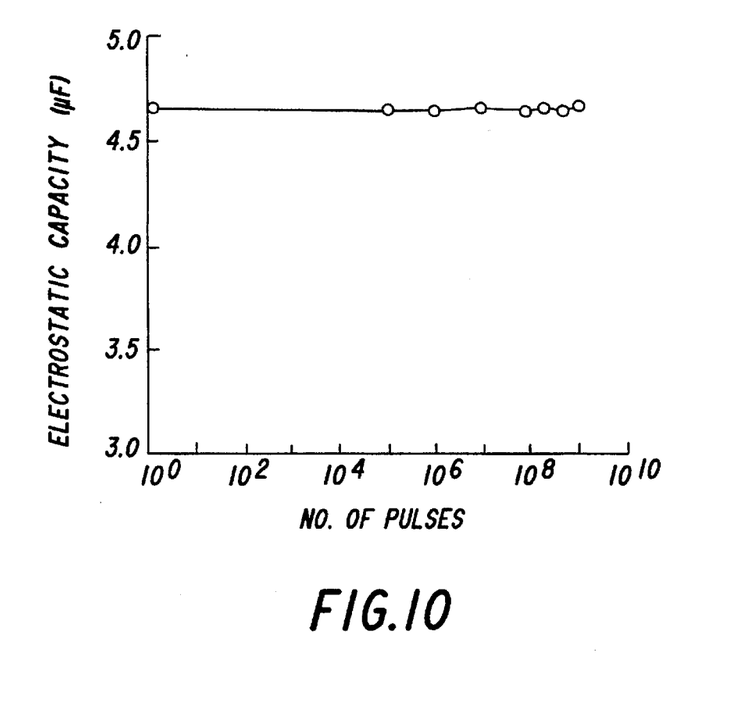
FIG. 10 is a diagram illustrating a change in electrostatic capacity as a result of a life test conducted on the actuator of the first embodiment of the present invention.

FIGS. 9 and 10 are diagrams illustrating a change in displacement and electrostatic capacity, respectively as a result of a life test conducted on the actuator of the first embodiment of the present invention.

In the test, $10^9$ pulses having a pulse-repetition frequency of 1 kilohertz (K Hz), a peak value of 50 volts and a duty ratio of 50% were applied to the actuator to measure displacement and electrostatic capacity. Measurement was conducted by temporarily halting application of a pulse and, for measurement of displacement, by applying 60 volts dc to the actuator. The test results show that the actuator operates stably without deterioration both in displacement and electrostatic capacity, as shown in FIGS. 9 and 10.

Figure 7A:
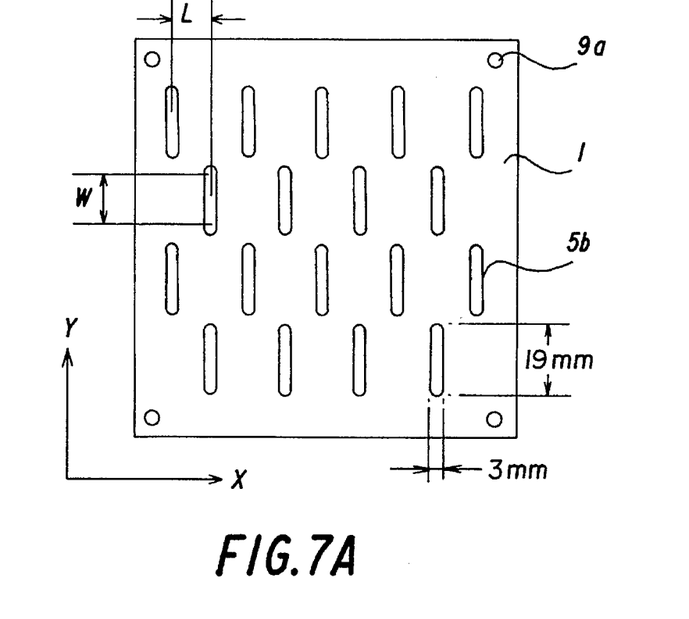
FIG. 7A is a top plan view of a green sheet having slits bored therethrough for use in an actuator of the second embodiment of the present invention.
Figure 7B:
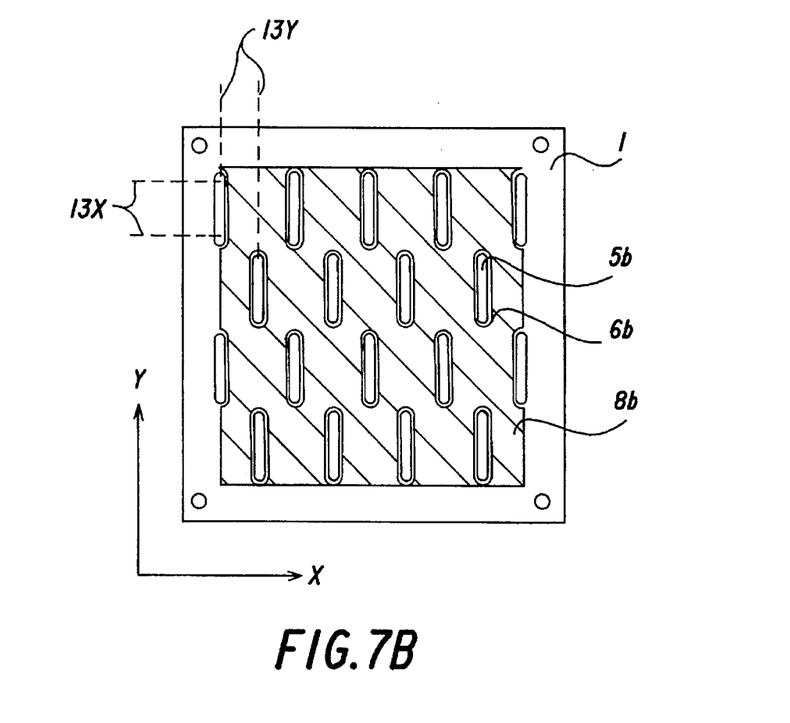
FIG. 7B is a top plan view of the green sheet shown in FIG. 7A with an internal electrode layer provided thereon.

The second embodiment of the present invention is described below:

FIG. 7A is a top plan view of a green sheet having slits bored therethrough for manufacturing a laminated piezoelectric actuator of the second embodiment of the present invention. FIG. 7B is a top plan view of the green sheet shown in FIG. 7A with an internal electrode layer provided thereon.

Since the slit 5b shown in FIG. 5 becomes the cavity 10 (see FIGS. 6A–6D) in the first embodiment, the internal electrode layers 8b formed on the green sheet 1 might contact each other, causing a short-circuit, if an excessive deformation develops in the laminated body in the firing process. To prevent the short-circuit, the second embodiment leaves a margin 6b around the slit 5b as shown in FIG. 7B. It also sets the width of the margin 6b to an optimum to prevent the margin 6b from acting as an inactive region, causing the same inconvenience as in the related art.

The laminated piezoelectric actuator of the second embodiment is fabricated as follows:

A 100 mm-square and 80 micron-thick green sheet 1 is formed as in the first embodiment. 3 mm-wide and 19 mm-long slits 5b arranged in the same way as in the first embodiment are bored through the green sheet 1 by using an automatic punch, as shown in FIG. 7A. Next, a 5 micron-thick internal electrode layer 8b as shown in FIG. 7B is formed by screen-printing silver palladium (Ag—Pd) paste on the green sheet 1 with 25 to 75, preferably 50, micron-wide margins 6b left around the slits 5b. The above process for boring the slits 5b and that for forming the internal electrode layer 8b may be reversed.

In a modification of this embodiment, it is considered to be within the scope of this invention to first provide an internal electrode sheet with voids in it of the proper shape and size to support the practice of this invention. After this electrode sheet is laminated to a green ceramic sheet, holes are formed in the green ceramic sheet within the confines of the voids in the electrode sheet. In the preferred aspect of this embodiment of this invention, a margin is left so that a portion of the green sheet which surrounds the holes protrudes within the voids. The size of this margin is the same as has been elsewhere specified. The means to form the voids and the holes in this embodiment of this invention are the same as those which have been elsewhere described.

Figure 8A:
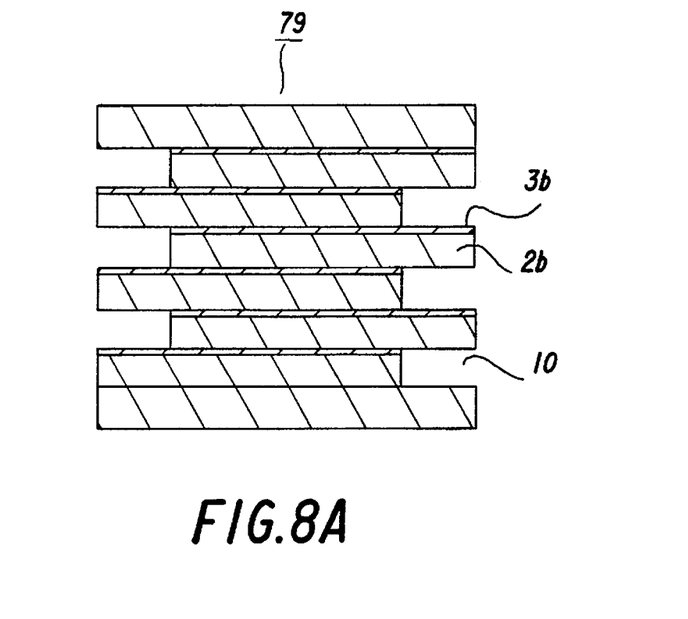
FIG. 8A is a conceptual sectional diagram illustrating an actuator element of the second embodiment of the present invention.
Figure 8B:
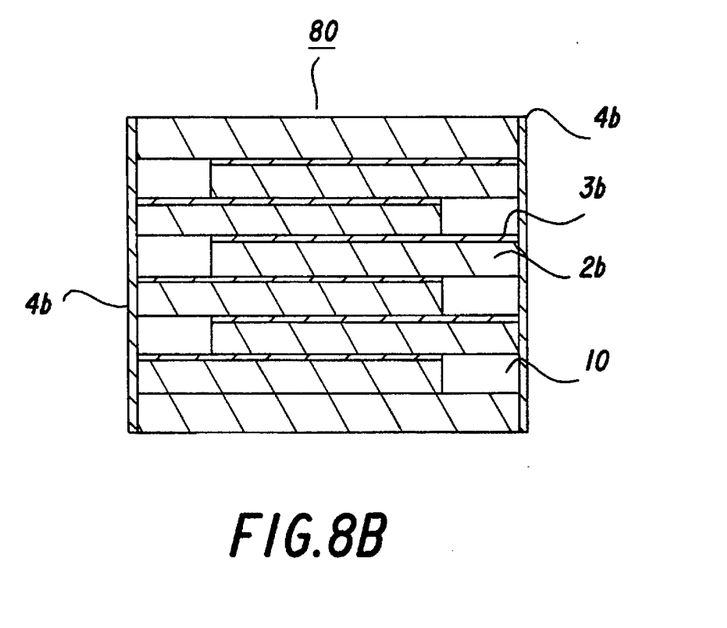
FIG. 8B is a conceptual sectional diagram illustrating an actuator of the second embodiment of the present invention.

Thereafter, through the same process as that in the first embodiment, an actuator element 79 is produced (see FIG. 8A) and an actuator 80 of the second embodiment is completed (see FIG. 8B). Reference numerals 2b, 3b and 4b refer, respectively to a ceramic layer, an internal electrode, and an external electrode. The margin 6b allows constructing the external electrodes 4b with conductive paste, without need of stuffing the insulator 7t in the slits 5t as in the related art.

The above-mentioned life test was conducted on the actuator of the second embodiment. In this test, too, the actuator operated stably without a change both in displacement and electrostatic capacity, as in FIGS. 9 and 10.

As is apparent from the above description, the present invention can fabricate a stably-operating and long-life laminated piezoelectric actuator through a process simpler than that of the related art, therefore, allowing mass production of the actuator.

What is claimed is:

1. A method of manufacturing a laminated piezoelectric actuator comprising at least an actuator element comprising a plurality of piezoelectric ceramic layers alternating with a plurality of internal electrode layers, and external electrodes connecting alternate internal electrode layers into two groups, said method comprising the steps of:

(a) providing a piezoelectric ceramic green sheet;

(b) disposing said ceramic green sheet in a plane of an orthogonal X-Y coordinate system with a lengthwise side of said sheet perpendicular to the X axis of said coordinate system;

(c) boring a plurality of spaced apart, elongated holes through said green sheet such that the holes are arranged parallel to each other in at least one line parallel to an X axis, wherein holes in two adjacent lines are staggered by half the length of a hole;

(d) providing a conductor layer on the green sheet formed in step (c), for use as internal electrodes, wherein the conductor layer has a plurality of voids so disposed that each void overlaps a corresponding hole sufficient to provide a margin between an internal edge of said void and an internal edge of said hole, to form a composite sheet;

(e) superposing a plurality of said composite sheets formed in step (d) such that the holes of alternate composite sheets are aligned with each other with the conductor layers of intervening composite sheets sandwiched in between to produce a parent actuator;

(f) cutting the parent actuator perpendicularly to the plane of the X-Y coordinates along a first straight line crossing the centers of the holes along a Y axis of the X-Y coordinates and along a second straight line crossing the holes along the X axis, to produce the actuator element having first sides and second sides which are sections developed by cutting the parent actuator along the first and second straight lines, respectively; and (g) forming external electrodes by conductively connecting exposed portions of the internal electrodes appearing alternately on each of the first sides of the actuator element.

2. A method of manufacturing a laminated piezoelectric actuator according to claim 1, wherein the void has a length longer than its width, the length and width being perpendicular and in parallel to the X axis, respectively, and wherein the margin has a width of 25 to 75 microns.

3. A method of manufacturing a laminated piezoelectric actuator comprising at least an actuator element comprising a plurality of piezoelectric ceramic layers alternating with a plurality of internal electrode layers, and external electrodes connecting alternate internal electrode layers into two groups, said method comprising the steps of:

(a) providing a piezoelectric ceramic green sheet;

(b) disposing said green sheet in a plane of an orthogonal X-Y coordinate system with a lengthwise side of said green sheet perpendicular to the X axis of said coordinate system;

(c) disposing a conductor layer, having a plurality of elongated voids arranged in at least one parallel line along an X axis, on said piezoelectric green sheet, for use as internal electrodes, to form a composite sheet wherein said voids in two adjacent lines are staggered and said adjacent lines are spaced apart by half the length of a void;

(d) boring holes through the green sheet within the internal edges of said voids of such size as to form a margin between the edges defining said voids and the edges defining said holes, respectively;

(e) superposing a plurality of composite sheets having holes an voids therein formed in step (d) such that the holes/voids of alternate composite sheets are aligned with each other and provided that the conductor layers of intervening composite sheets sandwiched therebetween are disposed between said holes/voids whereby producing a parent actuator having piezoelectric ceramic layers and internal electrode layers laminated alternately;

(f) cutting the parent actuator perpendicularly to a plane of the X-Y coordinates along a first straight line crossing centers of the holes along a Y axis of the X-Y coordinates and along a second straight line crossing the holes along the X axis of the X-Y coordinates, to produce an actuator element having first sides and second sides which are sections developed by cutting the parent actuator along the first and second straight lines, respectively; and (g) forming external electrodes by conductively connecting exposed portions of the internal electrodes appearing alternately on each of the first sides of the actuator element.

4. A method of manufacturing a laminated piezoelectric actuator according to claim 3, wherein the void has a length longer than its width, the length and width being perpendicular and in parallel to the X axis, respectively, and wherein the margin has a width of 25 to 75 microns.

5. A method of manufacturing a laminated piezoelectric actuator according to claim 1 or 3, wherein the external electrode of step (g) is a conductive foil.

6. A method of manufacturing a laminated piezoelectric actuator according to claim 1 or 3, wherein said superposing comprises the steps of:

providing at least two positioning holes in the composite sheets, disposed symmetrically with respect to an intersection of a straight line crossing a center of a particular hole along the Y axis and another straight line passing a middle of two adjacent lines along the X axis, and superposing a plurality of the composite sheets with alternate composite sheets rotated 180 degrees in the plane thereof, while maintaining the positioning holes in alignment.

7. A method of manufacturing a laminated piezoelectric actuator according to claim 1 or 3, wherein the elongated hole is a slit whose length is longer than its width, the length and width being perpendicular and in parallel to the X axis, respectively.

8. A method of manufacturing a laminated piezoelectric actuator according to claim 7, wherein the length of the slit is at least equal to the distance between said second sides of the actuator element.

9. A method of manufacturing a laminated piezoelectric actuator according to claim 7, wherein the distance between the lines of the slits along the X axis is at least equal to the length of the slit.

10. A method of manufacturing a laminated piezoelectric actuator according to claim 1 or 3, wherein the distance between holes is twice the distance between the first sides of the actuator element.

11. The method as claimed in claim 1 or 3, wherein said composite sheet consists essentially of one conductive layer over substantially the whole surface of one ceramic green sheet.

* * * * *